(12) United States Patent
Chiu et al.

(10) Patent No.: US 9,620,528 B2
(45) Date of Patent: Apr. 11, 2017

(54) DISPLAY PANEL

(71) Applicant: INNOLUX CORPORATION, Chu-Nan, Miao-Li County (TW)

(72) Inventors: Kuo-Hao Chiu, Chu-Nan (TW); Peng-Cheng Huang, Chu-Nan (TW); Hsia-Ching Chu, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/571,258

(22) Filed: Dec. 15, 2014

(65) Prior Publication Data
US 2015/0279858 A1 Oct. 1, 2015

(30) Foreign Application Priority Data

Mar. 28, 2014 (TW) .............................. 103111664 A

(51) Int. Cl.
| | | |
|---|---|---|
| *H01L 27/12* | (2006.01) | |
| *H01L 27/32* | (2006.01) | |
| *H01L 29/66* | (2006.01) | |
| *H01L 29/786* | (2006.01) | |
| *G02F 1/1362* | (2006.01) | |

(52) U.S. Cl.
CPC ...... H01L 27/124 (2013.01); G02F 1/136286 (2013.01); G02F 2201/40 (2013.01)

(58) Field of Classification Search
CPC ......... G02F 1/133753; G02F 1/136209; G02F 1/1337; G02F 1/1339; H01L 27/1248; H01L 27/1262; H01L 27/124

USPC ............................................................ 257/72
See application file for complete search history.

(56) References Cited

U.S. PATENT DOCUMENTS

| 5,663,525 | A | | 9/1997 | Newman | |
|---|---|---|---|---|---|
| 6,008,874 | A | * | 12/1999 | Kouno | .................. G02F 1/1337 349/123 |
| 6,590,627 | B2 | * | 7/2003 | Tomioka | ........... G02F 1/134363 349/106 |

(Continued)

FOREIGN PATENT DOCUMENTS

| CN | 102709241 | 10/2012 |
|---|---|---|
| JP | H1090702 | 4/1998 |

(Continued)

*Primary Examiner* — Long K Tran
*Assistant Examiner* — Thai T Vuong
(74) *Attorney, Agent, or Firm* — Liu & Liu

(57) ABSTRACT

A display panel is disclosed, which comprises: a substrate with a first surface, a first thin film transistor unit and a second thin film transistor unit disposed on the first surface of the substrate; a first conductive line with a first inclined surface, disposed on the first surface of the substrate and electrically connecting to the first thin film transistor unit; a second conductive line with a second inclined surface, disposed on the first surface of the substrate and electrically connecting to the second thin film transistor unit, wherein an angle included between the first surface and the first inclined surface or an extension surface thereof of the first conductive line is defined as a first angle, an angle included between the first surface and the second inclined surface or an extension surface thereof of the second conductive line is defined as a second angle, and the first angle is different from the second angle.

16 Claims, 4 Drawing Sheets

(56) References Cited

U.S. PATENT DOCUMENTS

| | | | | |
|---|---|---|---|---|
| 8,455,870 B2* | 6/2013 | Kim | .................... | G02F 1/13624 |
| | | | | 257/40 |
| 2001/0000437 A1* | 4/2001 | Tanaka | .............. | G02F 1/133512 |
| | | | | 349/110 |
| 2001/0040648 A1 | 11/2001 | Ono et al. | | |
| 2002/0163607 A1* | 11/2002 | Lee | ...................... | G02B 5/0252 |
| | | | | 349/106 |
| 2010/0053507 A1* | 3/2010 | Song | ................ | G02F 1/136209 |
| | | | | 349/84 |
| 2010/0097546 A1* | 4/2010 | Chang | .............. | G02F 1/136209 |
| | | | | 349/111 |
| 2011/0063535 A1* | 3/2011 | Chang | .............. | G02F 1/133512 |
| | | | | 349/37 |
| 2012/0281160 A1* | 11/2012 | Ono | ................. | G02F 1/133345 |
| | | | | 349/43 |
| 2013/0020574 A1 | 1/2013 | Sato | | |

FOREIGN PATENT DOCUMENTS

| | | |
|---|---|---|
| JP | 2001324725 | 11/2001 |
| JP | 2006293343 | 10/2006 |
| TW | 201025058 | 7/2010 |

* cited by examiner

DISPLAY PANEL

CROSS REFERENCE TO RELATED APPLICATION

This application claims the benefits of the Taiwan Patent Application Serial Number 103111664, filed on Mar. 28, 2014, the subject matter of which is incorporated herein by reference.

BACKGROUND OF THE INVENTION

1. Field of the Invention

The present invention relates to a display panel and, more particularly, to a display panel in which the decay of transmitted signals in circuits can be reduced.

2. Description of Related Art

As the techniques of display panel progress, the demands for the commercial display panels with high resolutions increase. Hence, many manufacturers actively developed high-level display panels. In particular, as the developments of 4K2K panels and mobile devices such as mobile phones and tablets with high PPI (pixels per inch), the display panels with more pixels in per unit area is the trend for the next generation.

However, in order to meet the requirement for high PPI, the currently used conductive lines including scan lines or data lines with identical widths may cause aperture ratio decreased. Hence, reducing the widths of the conductive lines is one means to accomplish the demand for high PPI and high aperture ratio. However, when the widths of the conductive lines are too small, the small conductive lines may be peeled off during the manufacturing process, and the resistance thereof may be increased, resulting in the decay of the transmitted signals.

Therefore, it is desirable to provide a display panel without the aforementioned problems to apply to the display panel with high PPI.

SUMMARY OF THE INVENTION

An object of the present invention is to provide a display panel, in which the resistance and the decay of transmitted signals in circuits can be reduced by adjusting the thickness or the profile of conductive lines in a display region of the display panel.

To achieve the object, the display panel of the present invention comprises: a substrate with a first surface; a first thin film transistor unit and a second thin film transistor unit respectively disposed on the first surface of the substrate; a first conductive line with a first inclined surface, disposed on the first surface of the substrate and electrically connecting to the first thin film transistor unit; and a second conductive line with a second inclined surface, disposed on the first surface of the substrate and electrically connecting to the second thin film transistor unit, wherein an angle included between the first surface and the first inclined surface or an extension surface thereof of the first conductive line is defined as a first angle, an angle included between the first surface and the second inclined surface or an extension thereof of the second conductive line is defined as a second angle, and the first angle is different from the second angle.

Herein, the first conductive line and the second conductively can respectively a scan line or a data line. In one aspect of the present invention, the first conductive line may be a scan line, and the second conductive line may be a data line. In this case, the second angle is larger than the first angle.

In addition, the display panel of the present invention may further comprise: a third conductive line and a fourth conductive line respectively disposed on the first surface of the substrate and respectively comprising a third inclined surface and a fourth inclined surface, wherein the first conductive line and the third conductive line are respectively disposed along a first direction, the second conductive line and the fourth conductive line are respectively disposed along a second direction, the first direction intersects the second direction, an angle included between the first surface and the third inclined surface or an extension surface thereof of the third conductive line is defined as a third angle, an angle included between the first surface and the fourth inclined surface or an extension surface thereof of the fourth conductive line is defined as a fourth angle, and the first angle is different from the third angle or the fourth angle. Herein the first conductive line and the third conductive line may be respectively a scan line, and the second conductive line and the fourth conductive line may be respectively a data line. In this case, an angle variation between the second angle and the fourth angle is smaller than that between the first angle and the third angle.

In the display panel of the present invention, each the first conductive line, the second conductive line, the third conductive line and the fourth conductive line can be respectively a scan line or a data line. In one aspect of the present invention, the first conductive line and the third conductive line are respectively the scan lines, and the second conductive line and the fourth conductive line are respectively the data lines.

In one aspect of the present invention, the first angle and the third angle respectively are θ11 and θ12, which satisfy the following equation (I):

$$|\theta 11-\theta 12|/\theta 11=1\text{-}60\% \tag{I}$$

In addition, the second angle and the fourth angle respectively are θ21 and θ22, which satisfy the following equation (II):

$$|\theta 21-\theta 22|/\theta 21=5\text{-}20\% \tag{II}$$

Furthermore, θ11, θ12, θ21 and θ22 satisfy the following equation (III):

$$|\theta 11-\theta 12|/\theta 11 \neq |\theta 21-\theta 22|/\theta 21 \tag{III}$$

The present invention further provides another display panel, comprising: a substrate; a first thin film transistor unit and a second thin film transistor unit respectively disposed on the substrate; a first conductive line disposed on the substrate and electrically connecting to the first thin film transistor unit; and a second conductive line disposed on the substrate and electrically connecting to the second thin film transistor unit, wherein a thickness of the first conductive line is defined as a first thickness, a thickness of the second conductive line is defined as a second thickness, and the first thickness is different from the second thickness.

Herein, the first conductive line and the second conductively can respectively a scan line or a data line. In one aspect of the present invention, the first conductive line may be a scan line, and the second conductive line may be a data line. In this case, the second thickness is larger than the first thickness.

In addition, the display panel of the present invention may further comprise: a third conductive line and a fourth conductive line respectively disposed on the substrate, wherein the first conductive line and the third conductive line are respectively disposed along a first direction, the second conductive line and the fourth conductive line are respectively disposed along a second direction, the first direction intersects the second direction, a thickness of the third conductive line is defined as a third thickness, a thickness of the fourth conductive line is defined as a fourth thickness, and the first thickness is different from the third thickness or the fourth thickness. Herein, the first conductive line and the third conductive line are respectively the scan lines, and the second conductive line and the fourth conductive line are respectively the data lines. In this case, a thickness variation between the second thickness and the fourth thickness is larger than that between the first thickness and the third thickness.

In the display panel of the present invention, each the first conductive line, the second conductive line, the third conductive line and the fourth conductive line can be respectively a scan line or a data line. In one aspect of the present invention, the first conductive line and the third conductive line are respectively the scan lines, and the second conductive line and the fourth conductive line are respectively the data lines.

In one aspect of the present invention, the first thickness and the third thickness respectively are M11 and M12, which satisfy the following equation (IV):

$$|M11-M12|/M11=5-20\% \tag{IV}$$

In addition, the second thickness and the fourth thickness respectively are M21 and M22, which satisfy the following equation (V):

$$|M21-M22|/M21=5-50\% \tag{V}$$

Furthermore, M11, M12, M21 and M22 satisfy the following equation (VI):

$$|M11-M12|/M11 \neq |M21-M22|/M21 \tag{VI}$$

The present invention further provides a display panel, in which the thicknesses of the conductive lines and the angles included between the first surface of the substrate and the inclined surfaces or the extensions thereof of the conductive lines simultaneously satisfy the aforementioned features.

In the present invention, the term "inclined surface" indicates a side surface connecting to an upper surface and a bottom surface of the conductive line, in which the upper surface and the bottom surface thereof are substantially parallel to the first surface of the substrate. In addition, in the present invention, both the terms "thickness" and "angle included between a first surface and an inclined surface or an extension thereof" indicate the thickness and the angle included between the first surface and the inclined surface or the extension thereof of a cross-section of the conductive line, in which the cross-section is a cross-section vertical to a length direction of the conductive line.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
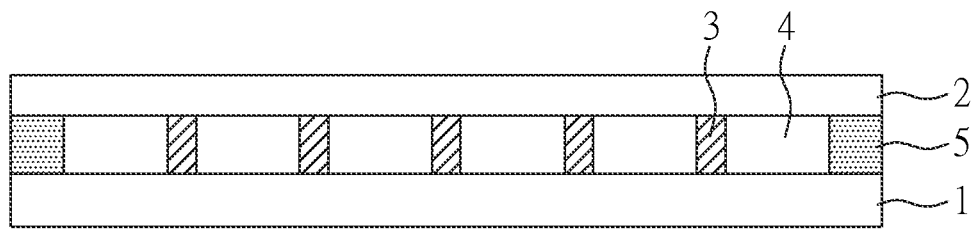
FIG. 1 is a perspective view of a liquid display panel according to Embodiment 1 of the present invention.

FIG. 1 is a perspective view of a liquid display panel of the present embodiment. The display panel of the present embodiment comprises: a thin film transistor (TFT) substrate 1, a color filter (CF) substrate 2, plural spacers 3, a liquid crystal layer 4 and a sealant 5. Herein, the TFT substrate 1 and the CF substrate 2 are opposite to each other, the spacers 3 and the liquid crystal layer 4 are disposed therebetween, and the TFT substrate 1 and the CF substrate 2 are assembled to each other with the sealant 5. Hereinafter, detail structures of units disposed on the TFT substrate 1 of the liquid display panel of the present embodiment are illustrated below.

Figure 2:
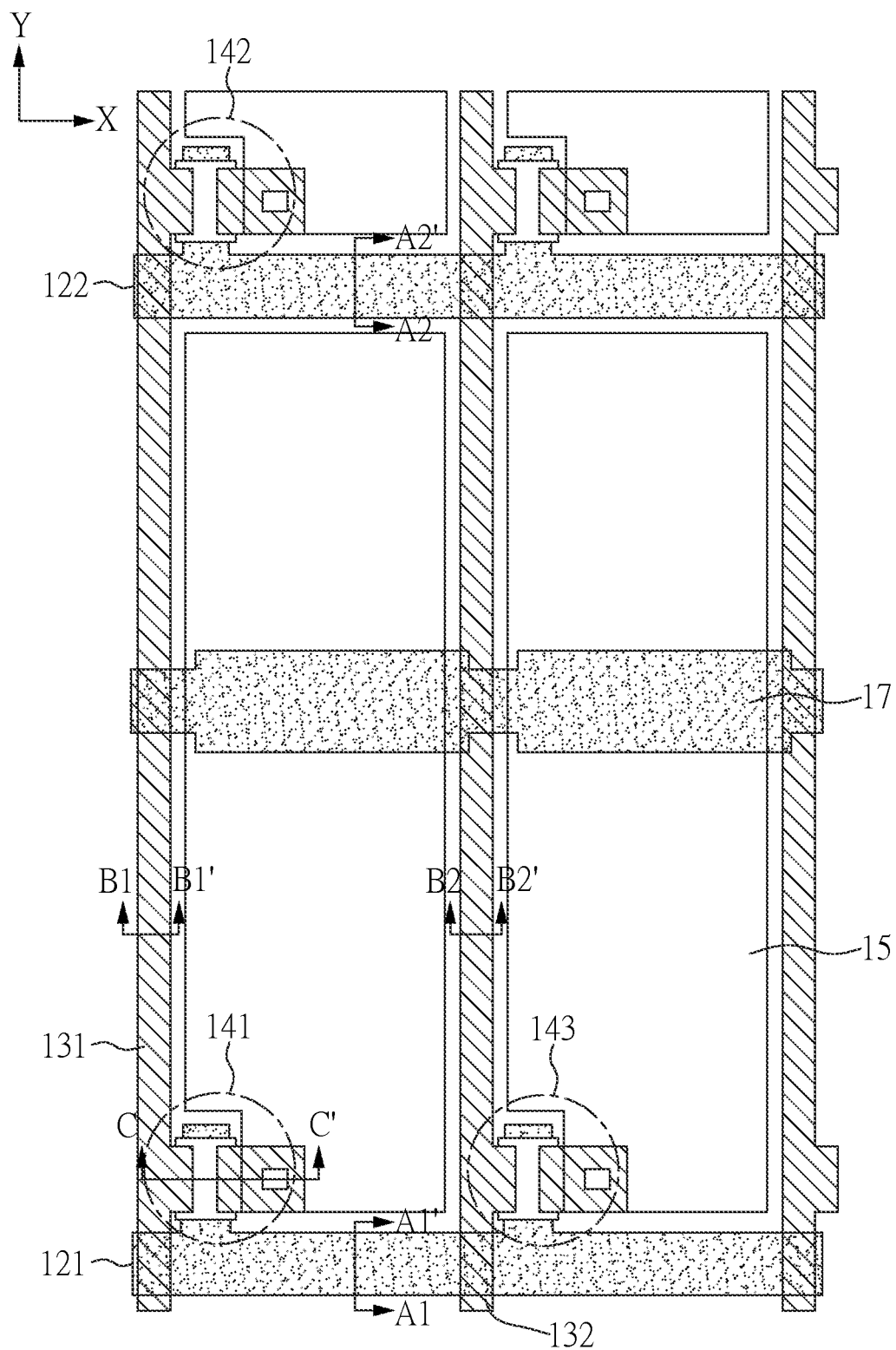
FIG. 2 is a perspective view of a thin film transistor substrate according to Embodiment 1 of the present invention.

FIG. 2 is a perspective view of the TFT substrate of the present embodiment. The TFT substrate of the present embodiment comprises: a first substrate (not shown in the figure), wherein plural conductive lines including scan lines 121, 122 and data lines 131, 132, a first thin film transistor (TFT) unit 141, second TFT units 142, 143, a pixel electrode 15 and a capacitor electrode 17 are disposed thereon. Herein, two adjacent scan lines 121, 122 and two adjacent data lines 131, 132 define a pixel unit, which comprises a TFT unit (i.e. the first TFT unit 141), a pixel electrode 15 and a capacitor electrode 17, and the pixel electrode 15 is located between two adjacent scan lines 121, 122 and two adjacent data lines 131, 132. Hereinafter, detail structures of the scan lines 121, 122 and the data lines 131, 132 of the liquid crystal panel of the present embodiment are illustrated below.

Figure 3:
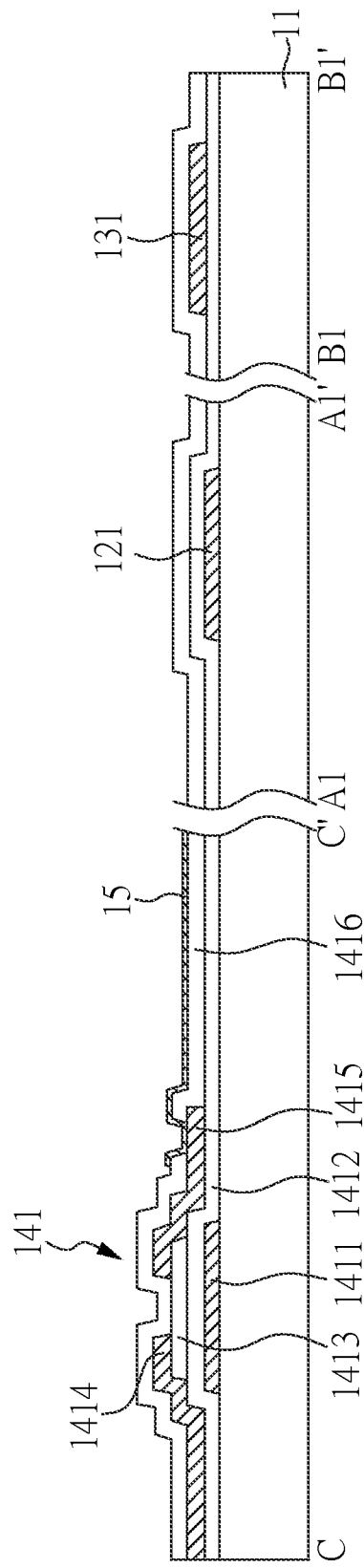
FIG. 3 is a cross-sectional view of a thin film transistor substrate according to Embodiment 1 of the present invention.

FIG. 3 is a cross-sectional view of the TFT substrate along the A1-A1', B1-B1' and C-C' lines of FIG. 2 according to Embodiment 1 of the present invention. Herein, only the first TFT unit 141 is exemplified, and the other TFT units can be manufactured through the same process. During the manufacturing process for the TFT substrate of the present embodiment, a gate electrode 1411 and a scan line 121 are firstly formed on the substrate 11, an insulating layer 1412 (also called as a gate insulating layer) is formed on the substrate 11, the gate electrode 1411 and the scan line 121, and then a semiconductor layer 1413 is formed on the gate electrode 1411. Next, a source electrode 1414 and a drain electrode 1415 is formed on the semiconductor layer 1413, a data line 131 is simultaneously formed on the insulating layer 1412, and thus the data line 131, the scan line 121, and a first TFT unit 141 are obtained. Then, a protection layer 1416 and a pixel electrode 15 are sequentially laminated to obtain the TFT substrate of the present embodiment. Herein, the gate electrode 1411, the scan line 121, the source electrode 1414, the drain electrode 1415, and the data line 131 can be prepared with any conductive material generally used in the art, such as metals, alloys, metal oxides, metal oxynitrides, or other electrode materials generally used in the art. Preferably, those units are prepared with metals, but the present invention is not limited thereto. The gate electrode 1411, the scan line 121, the source electrode 1414, the drain electrode 1415, and the data line 131 of the present embodiment are not limited to have a single layered structure prepared with only one material, and can have a composite structure with several laminated layers formed with different materials. In the present embodiment, the gate electrode 1411 and the scan line 121 respectively have a composite structure with a Ti layer and a Cu layer sequentially laminated from the side of the substrate 11; and the source electrode 1414, the drain electrode 1415, and the data line 131 respectively have a composite structure with a Mo layer, an Al layer and another Mo layer sequentially laminated from the side of the substrate 11. However, in other embodiment, the structures and the materials for the aforementioned units are not limited thereto.

Figure 4A:
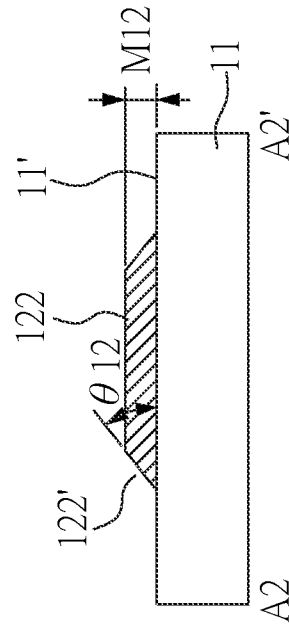
FIG. 4A is a cross-sectional view of a scan line on a thin film transistor substrate along the A1-A1' line of FIG. 2 according to Embodiment 1 of the present invention.
Figure 4B:
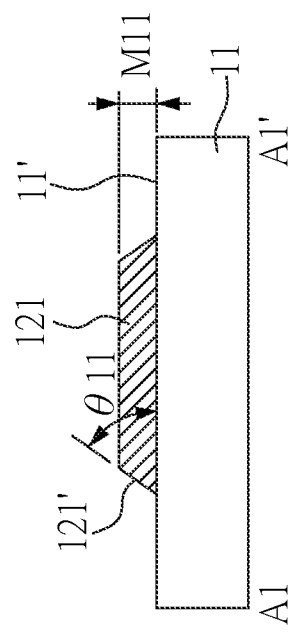
FIG. 4B is a cross-sectional view of a scan line on a thin film transistor substrate along the A2-A2' line of FIG. 2 according to Embodiment 1 of the present invention.
Figure 5A:
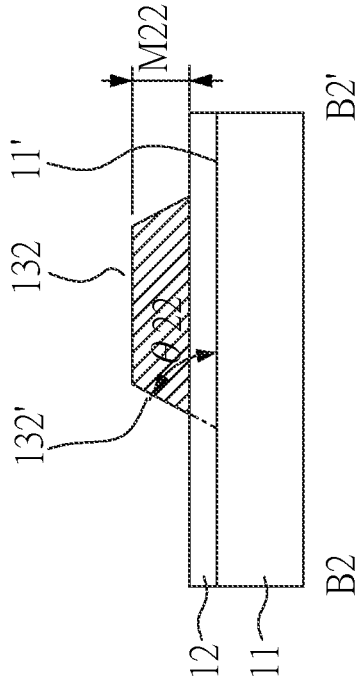
FIG. 5A is a cross-sectional view of a data line on a thin film transistor substrate along the B1-B1' line of FIG. 2 according to Embodiment 1 of the present invention.
Figure 5B:
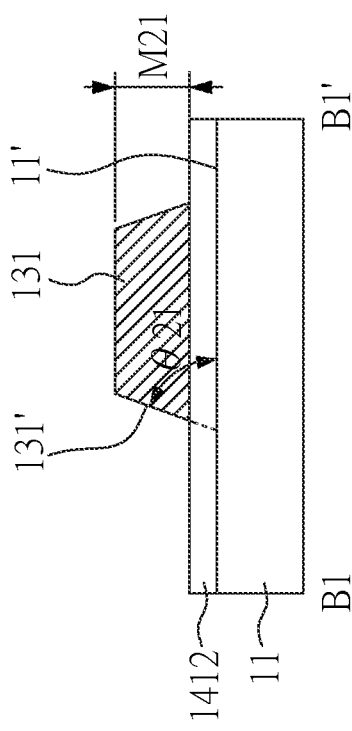
FIG. 5B is a cross-sectional view of a data line on a thin film transistor substrate along the B2-B2' line of FIG. 2 according to Embodiment 1 of the present invention.

FIGS. 4A and 4B are respectively a cross-sectional view of a scan line on a thin film transistor substrate along the A1-A1' line and the A2-A2' line of FIG. 2; and FIGS. 5A and 5B are respectively a cross-sectional view of a data line on a thin film transistor substrate along the B1-B1' line and the B2-B2' line of FIG. 2. In order to describe the designs of the data lines and the scan lines, other units disposed thereon are not shown in the figures. As shown in FIG. 2, the scan lines 121, 122 respectively electrically connect to the first TFT unit 141 and the second TFT unit 142, and are substantially arranged in parallel along a first direction Y. Also, as shown in FIGS. 4A and 4B, the scan lines 121, 122 respectively have an inclined surface 121', 122'. In addition, as shown in FIG. 2, the data lines 131, 132 respectively electrically connect to the first TFT unit 141 and the second TFT unit 143, and are substantially arranged in parallel along a second direction X. Also, as shown in FIGS. 5A and 5B, the data lines 131, 132 respectively have an inclined surface 131', 132'.

In the present embodiment, as shown in FIGS. 2, 4A and 4B, different scan lines 121, 122 have different thicknesses. More specifically, in the present embodiment, as shown in FIGS. 4A and 4B, the thickness M11 of the scan line 121 (the first thickness of the first conductive line) electrically connecting to the first TFT unit 141 is different from the thickness M12 of the scan line 122 (the third thickness of the second conductive line) electrically connecting to the second TFT unit 142. Preferably, the thickness variation between M11 and M12 satisfy the equation: |M11−M12|/M11=5-20%.

In addition, in the present embodiment, as shown in FIGS. 2, 5A and 5B, different data lines 131, 132 have different thicknesses. More specifically, in the present embodiment, as shown in FIGS. 5A and 5B, the thickness M21 of the data line 131 (the second thickness of the second conductive line) electrically connecting to the first TFT unit 141 is different from the thickness M22 of the data line 132 (the fourth thickness of the fourth conductive line) electrically connecting to the second TFT unit 143. Preferably, the thickness variation between M21 and M22 satisfy the equation: |M21−M22|/M21=5-50%.

Furthermore, in the present embodiment, as shown in FIGS. 2, 4A, 4B, 5A and 5B, the thickness variation between the thickness M21 of the data line 131 (the second thickness of the second conductive line) and the thickness M22 of the data line 132 (the fourth thickness of the fourth conductive line) is different from that between the thickness M11 of the scan line 121 (the first thickness of the first conductive line) and the thickness M12 of the scan line 122 (the third thickness of the third conductive line), which means that M11, M12, M21 and M22 satisfy the following equation (VI):

$$|M11-M12|/M11 \neq |M21-M22|/M21 \qquad (VI).$$

Preferably, the thickness variation between the thicknesses M21, M22 of the data lines 131 (the second thickness of the second conductive line) and the data line 132 (the fourth thickness of the fourth conductive line) is larger than that between the thicknesses M11, M12 of the scan line 121 (the first thickness of the first conductive line) and the scan line 122 (the third thickness of the third conductive line), i.e. |M11−M12|/M11<|M21−M22|/M21.

In the present embodiment, as shown in FIGS. 2, 4A, 4B, 5A and 5B, plural conductive lines such as the scan lines 121, 122 and the data lines 131, 132 are designed to have identical or different thicknesses. For the conventional display panel, the increased widths of the conductive lines including the scan lines and the data lines can decrease resistance, but the increased widths thereof result in the reduced aperture ratio, which cannot meet the requirement for high PPI resolution. Hence, in the present embodiment, the thicknesses of the conductive lines are increased in the region with larger load during signal transmission to accomplish the purpose of reducing resistance to decrease the decay of the transmitted signals as well as to maintain high aperture ratio. Preferably, the thicknesses M21, M22 of the data lines 131, 132 are larger than the thicknesses M11, M12 of the scan lines 121, 122. The increased widths of the scan lines can increase conductive area to reduce the resistance, but the increased widths of the data lines result in the aperture ratio decreased. Hence, in the present embodiment, in order to prevent the decay of the transmitted signals and maintain high aperture ratio, the thicknesses of the data lines are increased to accomplish the purpose of reducing the width of the data lines to maintain high aperture ratio and prevent the transmitted signal decay.

In the display panel of the present embodiment, the thicknesses of partial scan lines are respectively 0.56 μm, 0.571 μm, 0.571 μm, 0.571 μm, 0.571 μm, 0.571 μm, 0.582 μm, 0.582 μm and 0.582 μm, in which the differences between the thicknesses of the aforementioned scan lines are located in a range from 0.01 μm to 0.02 μm. In addition, the thicknesses of partial data lines are respectively 0.615 μm, 0.681 μm, 0.637 μm, 0.593 μm, 0.626 μm, 0.626 μm, 0.648 μm, 0.692 μm and 0.659 μm, in which the differences between the thicknesses of the aforementioned data lines are located in a range from 0.02 μm to 0.1 μm. However, the thicknesses of the other scan lines and data lines in the display panel of the present embodiment are not limited to the aforementioned values, as long as the thicknesses thereof comply with the aforementioned requirements; and therefore the purpose of maintaining aperture ratio, reducing resistance, and reducing transmitted signal decay can be accomplished.

Furthermore, in the present embodiment, as shown in FIGS. 2, 4A and 4B, the angles θ11 and θ12 included between the first surface 11' of the substrate 11 and the inclined surfaces 121', 122' of the scan lines 121, 122 are different from each other. Hereinafter, "the angle θ11 included between the first surface 11' of the substrate 11 and the inclined surface 121 of the scans line 121" and "the angle θ12 included between the first surface 11' of the substrate 11 and the inclined surface 122' of the scans line 122" are respectively called "the angle θ11" and "the angle θ12" for short. More specifically, in the present embodiment, the angle θ11 of the scan line 121 (the first angle of the first conductive line) electrically connected to the first TFT unit 141 is different from the angle θ12 of the scan line 122 (the third angle of the third conductive line) electrically connected to the first TFT unit 142. Preferably, the angle variation between θ11 and θ12 satisfy the equation: |θ11−θ12|/θ11=1-60%.

In addition, in the present embodiment, as shown in FIGS. 2, 5A and 5B, the angles θ21 and θ22 included between the first surface 11' of the substrate 11 and the extension surfaces of the inclined surfaces 131', 132' of the data lines 131, 132 are different from each other. Hereinafter, "the angle θ21 included between the first surface 11' of the substrate 11 and the extension surface of the inclined surface 131' of the data line 131" and "the angle θ22 included between the first surface 11' of the first substrate 11 and the extension surface of the inclined surface 132' of the data line 132" are respectively called "the angle θ21" and "the angle θ22" for short. More specifically, in the present embodiment, the angle θ21 of the data line 131 (the second angle of the second conductive line) electrically connected to the first TFT unit 141 is different from the angle θ22 of the data line 132 (the fourth angle of the fourth conductive line) electrically connected to the first TFT unit 143. Preferably, the angle variation between θ21 and θ22 satisfy the equation: |θ21−θ22|/θ21=5-20%.

Furthermore, in the present embodiment, as shown in FIGS. 2, 4A, 4B, 5A and 5B, the angle variation between the angle θ21 of the data line 131 (the second angle of the second conductive line) and the angle θ22 of the data line 132 (the fourth angle of the fourth conductive line) is different from that between the angle θ11 of the scan line 121 (the first angle of the first conductive line) and the angle θ12 of the scan line 122 (the third angle of the third conductive line), which means θ11, θ12, θ21 and θ22 satisfy the following equation (III):

$$|θ11−θ12|/θ11 \neq |θ21−θ22|/θ21 \quad (III).$$

Preferably, the angle variation between the angles θ21, θ22 of the data line 131 (the second angle of the second conductive line) and the data line 132 (the fourth angle of the fourth conductive line) is smaller than that between the angles θ11, θ12 of the scan line 121 (the first angle of the first conductive line) and the scan line 122 (the third angle of the third conductive line), i.e. |θ11−θ12|/θ11>|θ21−θ22|/θ21.

In the present embodiment, as shown in FIGS. 2, 4A, 4B, 5A and 5B, plural conductive lines such as the scan lines 121, 122 and the data lines 131, 132 are designed to have identical or different included angles. Although the thicknesses of the plural conductive lines can be varied as described above, the included angles thereof can also be varied to obtain different resistances when the thicknesses thereof cannot be easily controlled during the manufacturing process thereof. Preferably, the angles θ21, θ22 of the data lines 131, 132 are designed to be larger than the angles θ11, θ12 of the scan lines 121, 122. In the case that the slops of the inclined surfaces 131', 132' of the data lines 131, 132 are larger than those of the inclined surfaces 121', 122' of the scan lines 121, 122, the problem that the increased angles θ21, θ22 of the data lines result in the aperture ratio reduced can be prevented when the widths thereof reduced and the thickness thereof increased to decrease the transmitted signal decay.

In the display panel of the present invention, the included angles of partial scan lines are respectively 30.96°, 34.99°, 21.91°, 42.84°, 20.72°, 40.76°, 36.25°, 47.34° and 40.56°, in which the differences between the angles of the aforementioned scan lines are located in a range from 1° to 26°. In addition, the included angles of partial data lines are respectively 64.3°, 69.4° and 77°, in which the differences between the angles of the aforementioned data lines are located in a range from 5° to 12°. However, the angles of the other scan lines and data lines in the display panel of the present embodiment are not limited to the aforementioned values, as long as the angles thereof comply with the aforementioned requirements; and therefore the purpose of maintaining aperture ratio, reducing resistance, and reducing transmitted signal decay can be accomplished.

In the present invention, the thicknesses and the angles of the data lines and the scan lines can be controlled through any conventional patterned process used in the art, such as the process by controlling the etching conditions, and the process with half-tone masks.

Embodiment 2

The structure and the preparation process of the display panel of the present embodiment are the same as those illustrated in Embodiment 1, and the requirements for the thicknesses and the included angles of the scan lines and the data lines on the TFT substrate are also the same as those illustrated in Embodiment 1, except for the following differences.

In the present embodiment, the gate electrode 1411, the scan line 121, the source electrode 1414, the drain electrode 1415, and the data line 131 respectively have a composite structure with a Ti layer and a Cu layer sequentially laminated from the side of the substrate 11. However, in other embodiment of the present invention, the structures and the materials for aforementioned units are not limited thereto.

In addition, in the display panel of the present embodiment, the thicknesses of partial scan lines are respectively 0.465 μm, 0.482 μm, 0.454 μm, 0.448 μm, 0.465 μm, 0.442 μm, 0.431 μm, 0.459 μm and 0.482 μm, in which the differences between the thicknesses of the aforementioned scan lines are located in a range from 0.01 μm to 0.05 μm. In addition, the thicknesses of partial data lines are respectively 0.478 μm, 0.469 μm, 0.496 μm, 0.532 μm, 0.514 μm, 0.496 μm, 0.487 μm, 0.46 μm and 0.469 μm, in which the differences between the thicknesses of the aforementioned data lines are located in a range from 0.01 μm to 0.07 μm. However, the thicknesses of the other scan lines and data lines in the display panel of the present embodiment are not limited to the aforementioned values Furthermore, in the display panel of the present embodiment, the included angles of partial scan lines are respectively 34.42°, 27.8°, 24.83°, 27.76°, 19.83°, 25.46°, 18.25°, 40.79° and 27.51°, in which the differences between the angles of the aforementioned scan lines are located in a range from 2° to 22°. In addition, the included angles of partial data lines are respectively 65.56°, 56.73°, 60.95°, 62.1°, 61.26°, 55.92°, 60.26°, 60.8 and 54.16°, in which the differences between the angles of the aforementioned data lines are located in a range from 2° to 11°. However, the angles of the other scan lines and data lines in the display panel of the present embodiment are not limited to the aforementioned values.

In the aforementioned Embodiments 1 and 2, only the liquid crystal panels assembled with the conventional TFT substrate and the CF substrate are illustrated. However, other display panels known in the art such as color on array (COA) display panels, organic light emitting diode (OLED) display panels, plasma display panels and the like can equipped with the aforementioned TFT substrates as illustrated in Embodiments 1 and 2 to accomplish the purpose of maintaining aperture ratio, reducing resistance, and reducing transmitted signal decay can be accomplished.

Furthermore, the display panel provided by the present invention can be applied to any electronic devices such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A display panel, comprising:
   a substrate with a first surface;
   a plurality of pixel electrodes disposed on the first surface of the substrate;
   a first thin film transistor unit and a second thin film transistor unit respectively disposed on the first surface of the substrate;
   a first conductive line with a first inclined surface, disposed on the first surface of the substrate and electrically connecting to the first thin film transistor unit;
   a second conductive line with a second inclined surface, disposed on the first surface of the substrate and electrically connecting to the second thin film transistor unit, and
   a third conductive line and a fourth conductive line respectively disposed on the first surface of the substrate and respectively comprising a third inclined surface and a fourth inclined surface,
   wherein the first conductive line and the third conductive line are respectively disposed along a first direction, the second conductive line and the fourth conductive line are respectively disposed along a second direction, the first direction intersects the second direction,
   wherein an angle included between the first surface and the first inclined surface or an extension surface thereof of the first conductive line is defined as a first angle, an angle included between the first surface and the third inclined surface or an extension surface thereof of the third conductive line is defined as a second angle, and the first angle is different from the second angle,
   wherein the first conductive line and the third conductive line are spaced by at least one of the pixel electrodes, the second conductive line and the fourth conductive line are spaced by at least one of the pixel electrodes, and
   wherein the first conductive line and the third conductive line are two scan lines, the second conductive line and the fourth conductive line are two data lines.

2. The display panel as claimed in claim 1, wherein the second angle is greater than the first angle.

3. The display panel as claimed in claim 1, wherein an angle included between the first surface and the second inclined surface or an extension surface thereof of the second conductive line is defined as a third angle, an angle included between the first surface and the fourth inclined surface or an extension surface thereof of the fourth conductive line is defined as a fourth angle, and the first angle is different from the third angle or the fourth angle.

4. The display panel as claimed in claim 3, wherein an angle variation between the second angle and the fourth angle is smaller than that between the first angle and the third angle.

5. The display panel as claimed in claim 3, wherein the first angle and the third angle respectively are $\theta 11$ and $\theta 12$, which satisfy the following equation (I):

$$|\theta 11-\theta 12|/\theta 11=1\text{-}60\% \qquad (I).$$

6. The display panel as claimed in claim 3, wherein the second angle and the fourth angle respectively are $\theta 21$ and $\theta 22$, which satisfy the following equation (II):

$$|\theta 21-\theta 22|/\theta 21=5\text{-}20\% \qquad (II).$$

7. The display panel as claimed in claim 3, wherein the first angle and the third angle respectively are $\theta 11$ and $\theta 12$, and the second angle and the fourth angle respectively are $\theta 21$ and $\theta 22$, which satisfy the following equation (III):

$$|\theta 11-\theta 12|/\theta 11 \neq |\theta 21-\theta 22|/\theta 21.$$

8. The display panel as claimed in claim 1, wherein a thickness of the first conductive line is different from that of the third conductive line.

9. A display panel, comprising:
   a substrate;
   a plurality of pixel electrodes disposed on the substrate;
   a first thin film transistor unit and a second thin film transistor unit respectively disposed on the substrate;
   a first conductive line disposed on the substrate and electrically connecting to the first thin film transistor unit;
   a second conductive line disposed on the substrate and electrically connecting to the second thin film transistor unit, and
   a third conductive line and a fourth conductive line respectively disposed on the substrate,
   wherein the first conductive line and the third conductive line are respectively disposed along a first direction, the second conductive line and the fourth conductive line are respectively disposed along a second direction, the first direction intersects the second direction,
   wherein a thickness of the first conductive line is defined as a first thickness, a thickness of the third conductive line is defined as a second thickness, and the first thickness is different from the second thickness,
   wherein the first conductive line and the third conductive line are spaced by at least one of the pixel electrodes, the second conductive line and the fourth conductive line are spaced by at least one of the pixel electrodes, and
   wherein the first conductive line and the third conductive line are two scan lines, the second conductive line and the fourth conductive line are two data lines.

10. The display panel as claimed in claim 9, wherein the second thickness is larger than the first thickness.

11. The display panel as claimed in claim 9, wherein a thickness of the second conductive line is defined as a third thickness, a thickness of the fourth conductive line is defined as a fourth thickness, and the first thicknesses is different from the third thickness or the fourth thickness.

12. The display panel as claimed in claim 11, wherein a thickness variation between the second thicknesses and the fourth thickness is larger than that between the first thicknesses and the third thickness.

13. The display panel as claimed in claim 11, wherein the first thicknesses and the third thickness respectively are M11 and M12, which satisfy the following equation (IV):

$$|M11-M12|/M11=5\text{-}20\% \quad \text{(IV)}.$$

14. The display panel as claimed in claim 11, wherein the second thicknesses and the fourth thickness respectively are M21 and M22, which satisfy the following equation (V):

$$|M21-M22|/M21=5\text{-}50\% \quad \text{(V)}.$$

15. The display panel as claimed in claim 11, wherein the first thicknesses and the third thickness respectively are M11 and M12, and the second thicknesses and the fourth thickness respectively are M21 and M22, which satisfy the following equation (IV):

$$|M11-M12|/M11 \neq |M21-M22|/M21 \quad \text{(IV)}.$$

16. The display panel as claimed in claim 9, wherein the substrate has a first surface, the first conductive line has a first inclined surface, the third conductive line has a third inclined surface, and an angle included between the first surface and the first inclined surface or an extension surface thereof of the first conductive line is defined as a first angle, an angle included between the first surface and the third inclined surface or an extension surface thereof of the third conductive line is defined as a second angle, and the first angle is different from the second angle.

* * * * *